(12) United States Patent
Davidson

(10) Patent No.: US 6,904,551 B1
(45) Date of Patent: Jun. 7, 2005

(54) METHOD AND CIRCUIT FOR SETUP AND HOLD DETECT PASS-FAIL TEST MODE

(75) Inventor: Colin Davidson, Basingstoke (GB)

(73) Assignee: Cypress Semiconductor Corporation, San Jose, CA (US)

( * ) Notice: Subject to any disclaimer, the term of this patent is extended or adjusted under 35 U.S.C. 154(b) by 437 days.

(21) Appl. No.: 09/790,159

(22) Filed: Feb. 20, 2001

(51) Int. Cl.[7] ............................................. G11C 29/00
(52) U.S. Cl. ........................................ 714/718; 714/745
(58) Field of Search ........................... 714/718, 27, 33, 714/715, 719, 722, 726, 727; 326/16; 365/200, 201

(56) References Cited

U.S. PATENT DOCUMENTS

| | | | | |
|---|---|---|---|---|
| 4,933,662 A | * | 6/1990 | Szczepanek | 340/146.2 |
| 4,968,902 A | * | 11/1990 | Jackson | 327/74 |
| 5,311,473 A | * | 5/1994 | McClure et al. | 365/201 |
| 5,524,114 A | * | 6/1996 | Peng | 714/724 |
| 5,526,286 A | * | 6/1996 | Sauerwein et al. | 702/79 |
| 5,535,223 A | * | 7/1996 | Horstmann et al. | 714/744 |
| 5,686,846 A | * | 11/1997 | Holcomb et al. | 327/37 |
| 5,768,159 A | * | 6/1998 | Belkadi et al. | 703/19 |
| 5,784,323 A | * | 7/1998 | Adams et al. | 365/201 |
| 5,946,712 A | * | 8/1999 | Lu et al. | 711/167 |
| 5,991,890 A | * | 11/1999 | Brown et al. | 713/503 |
| 6,104,589 A | * | 8/2000 | Williamson | 361/111 |
| 6,243,414 B1 | * | 6/2001 | Drucker et al. | 375/222 |
| 6,271,699 B1 | * | 8/2001 | Dowlatabadi | 327/170 |
| 6,311,148 B1 | * | 10/2001 | Krishnamoorthy | 703/19 |
| 6,381,722 B1 | * | 4/2002 | Salmon et al. | 714/745 |
| 6,457,148 B1 | * | 9/2002 | Yoshiba | 714/718 |
| 6,484,289 B1 | * | 11/2002 | Hsu | 714/820 |
| 6,535,999 B1 | * | 3/2003 | Merritt et al. | 714/30 |

OTHER PUBLICATIONS

Balajee et al., "Automated AC (timing) Characterization for digital circuit testing", Proceeds of Intl. confer. on VLSI Design, Chennai, India, 1998, pp. 374–377.*
Abbasi, "Logic Synthesis Using Synopsys", Kluwer Academic Publishers, 1997, 2nd Edition, pp. 1–3.*

* cited by examiner

*Primary Examiner*—Guy J. Lamarre
(74) *Attorney, Agent, or Firm*—Wagner, Murabito & Hao LLP

(57) ABSTRACT

A method and circuit thereof for performing setup and hold (SUAH) testing on integrated circuits including, but not limited to SRAM, utilizing a relatively low number of test vectors, obviating the conventional requirement of writing to and reading back from each and every memory address. In one embodiment, a first test data signal of all zeros (0) is inputted to the input stage of the SRAM under test, and a subsequent second data signal of all ones (1) follows. In one embodiment, XOR/XNOR gates detect differences in data signals between the inputs and outputs of input stage latches/registers after clocking. In one embodiment, detected differences are combined into an error signal in combinational logic. In one embodiment, error signals are exported serially to a test system by a scan chain. Alternatively, in another embodiment, error signals are exported in parallel via individual output drivers.

20 Claims, 10 Drawing Sheets

METHOD AND CIRCUIT FOR SETUP AND HOLD DETECT PASS-FAIL TEST MODE

BACKGROUND OF THE INVENTION

1. Field of the Invention

The present invention relates to the field of on-chip test circuits. Specifically, the invention is designed to perform a set-up and hold (SUAH) test function.

2. Related Art

In the manufacture of silicon and other microelectronic devices, such as integrated circuits (IC), various testing functions are performed including the active testing of wafers and dies in which the ICs are embedded prior to their isolation. One such test, especially important in testing the functionality of synchronous static random access memories (SRAM) and application specific integrated circuits (ASIC), is the setup and hold (SUAH) test. SUAH testing determines whether SRAM, ASIC, or other integrated circuit designs meet crucial synchronous timing parameter specifications. Setup refers to the time in which a data signal has to be at a certain circuit locus prior to a clock transition signal. Hold refers to the duration of time for which a data signal must be held at a circuit locus after the clock signal has gone to a high value.

With reference to synchronous memories for example, the parameter to be measured is the SUAH time to the clock on input and some of the output registers. Although there is a numerical time value associated with this parameter, its test basically seeks a "go/no go," or pass/fail result at given time values. In testing this parameter, it has been sometimes difficult to decide the character of the result as pass or fail.

SUAH tests are performed using an external logic analyzing test system, which evokes the pass/fail result. The test system sets a numerical value on the input of the clock. By way of illustration, on the exemplary memory, a 1.5 nanosecond (ns) setup specification is set for test. In this illustration, the test system sets 1.5 ns as the clock pulse time value. The functionality of the circuit under test, in this case the synchronous memory, is checked at that timing value. If the circuit under test is functional at 1.5 ns, the SUAH test result at that value is a pass. Conversely, if the circuit is non-functional at that timing value, the test result is a failure at 1.5 ns. If the memory circuit passes the SUAH test at 1.5 ns, and its functionality must be checked at an even smaller time value, e.g., 1.4 ns, the test system repeats the SUAH test at that value. The SUAH test can be repeated any number of times at sequentially smaller and smaller time values to find the time value point at which the circuit under test will no longer function; e.g., 1.3 ns, 1.25 ns, 1.2 ns, etc.

In the conventional art, a problem arises in the performance of SUAH tests on large scale and especially, very large scale ICs (LSI, VLSI) such as SRAM, in detecting whether or not a circuit passes or fails. On such large systems, in order to detect that a circuit has either passed or failed a SUAH test, a significant number of test vectors are necessary, on the order of hundreds of thousands ($10^5$) or millions ($10^6$), possibly simply in order to detect whether a single register therein passes or fails. This problem can be illustrated, again using the synchronous memory system, for example. An exemplary SRAM with 18 line address registers requires $2^{18}$ test vectors, simply to perform SUAH testing on the input latches. SUAH testing in accordance with the conventional art necessitates addressing each and every location in the memory, all $2^{18}$ of them, to test the input latches. Test data must be written to each and every one of the $2^{18}$ addresses, and then read back from each and every one of the 218 addresses, to perform a valid SUAH test per the conventional art.

Synchronous SRAM's have clocked input address, data, and control registers/latches. Performance of SUAH tests involves writing data, address, and control bits into the device. In pipelined/complex SRAM components, multiple cascaded registers/latches involve multiple clock cycles to write data to their required addresses. These data must then be read back from their addresses to test the SUAH function and determine if it is a pass or a failure. This read back again may involve multiple clock cycles to shift the outputs of the SRAM to the output buffer. The passage of time involved in the multiple clock cycles required to accomplish these serial tasks further increases the time required to complete SUAH tests, and consequently increases costs involved. This places a substantial overhead burden on testing resources, and is quite significant in terms of the cost of testing in time, resources, and expense.

Accordingly, what is needed is a method and/or circuit for performing SUAH tests with a much lower requisite number of test vectors. What is also needed is a method and/or circuit for performing SUAH tests on memory systems and other ICs without having to writing back into memory. Further, what is needed is a method and or circuit for performing SUAH testing at a register stage without the need to grossly involve other IC stages. Yet further, what is needed is a method and/or circuit for performing SUAH which can substantially reduce the overhead burden on testing resources relative to existing methods and circuits, and further, significantly lower the cost of such testing in time, resources, and expense.

DISCLOSURE OF THE INVENTION

The present invention provides a method and circuit thereof for performing setup and hold (SUAH) testing with a reduced number of requisite test vectors. The present invention also provides a method and circuit for performing SUAH testing on memory systems and other ICs without having to write back into the memory, by directly testing the input latch stage. The present invention further provides a method and system for performing SUAH testing at the register stage, which does not require gross involvement of other IC stages. Further still, the present invention provides a method and system for SUAH testing with a relatively small overhead burden on testing resources and low time, resource, and monetary cost.

One embodiment of the present invention provides a method and circuit for performing SUAH testing with a reduced number of requisite test vectors. The method and circuit of this embodiment enable even very large scale, complex ICs, including but not limited to large memory systems such as synchronous SRAM's, and ASICs to be accurately and precisely tested with a relatively small array of test vectors.

In another embodiment, the present invention also provides a method and circuit for performing SUAH testing on memory systems without having to write back to the memory by direct testing of the latches of the input stage. The method and circuit thus embodied enables SUAH testing free of the constraints of any of the particular data, controls, and addresses of the device. Thus, even in pipelined/complex SRAM and ASIC components with cascaded registers/latches, this embodiment of the present invention averts the need for multiple clock cycles, which would otherwise be required for sequentially writing data to each and every one of their addresses, and then reading the data back from these addresses to test to detect a test pass or a failure result.

In yet another embodiment, the present invention provides a method and circuit for performing SUAH testing at the register stage, which does not require gross involvement of other IC stages. This embodiment's method and circuit also enables SUAH testing free of the constraints of any of the particular data, controls, and addresses of the device. Thus, even pipelined/complex SRAMs, ASICs, and other ICs with cascaded registers/latches are rendered testable herein by simply directly monitoring the inputs and outputs of individual particular registers.

In yet another embodiment still, the present invention provides a method and system for SUAH testing which places a relatively small overhead burden on testing resources and low time, resource, and monetary cost. Further, the advantages and benefits to test brevity and simplicity contributed jointly, severally, or individually by the foregoing embodiments may combine to augment the advantage conferred by the present embodiment. For example, by using only two single clock cycles to perform the SUAH test in one embodiment, the test duration is accordingly very short. More, multiple clock cycles are obviated by the embodiment dispensing with the write back and read/particular address requirement, accordingly also reducing the duration of the test. By requiring use of a small test vector array in one embodiment, the test is simplified. The individual effect of this embodiment, or the combined effects of some or all of the other embodiments with it, make the overall burden posed on the testing overhead quite small. This has the advantageous effect of making a SUAH test by the methods and circuits of any or all of the embodiments of the present invention relatively inexpensive, monetarily and otherwise.

These and other objects and advantages of the present invention will become obvious to those of ordinary skill in the art after reading the following detailed description of the preferred embodiments, which are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

DETAILED DESCRIPTION OF THE INVENTION

Figure 1A:
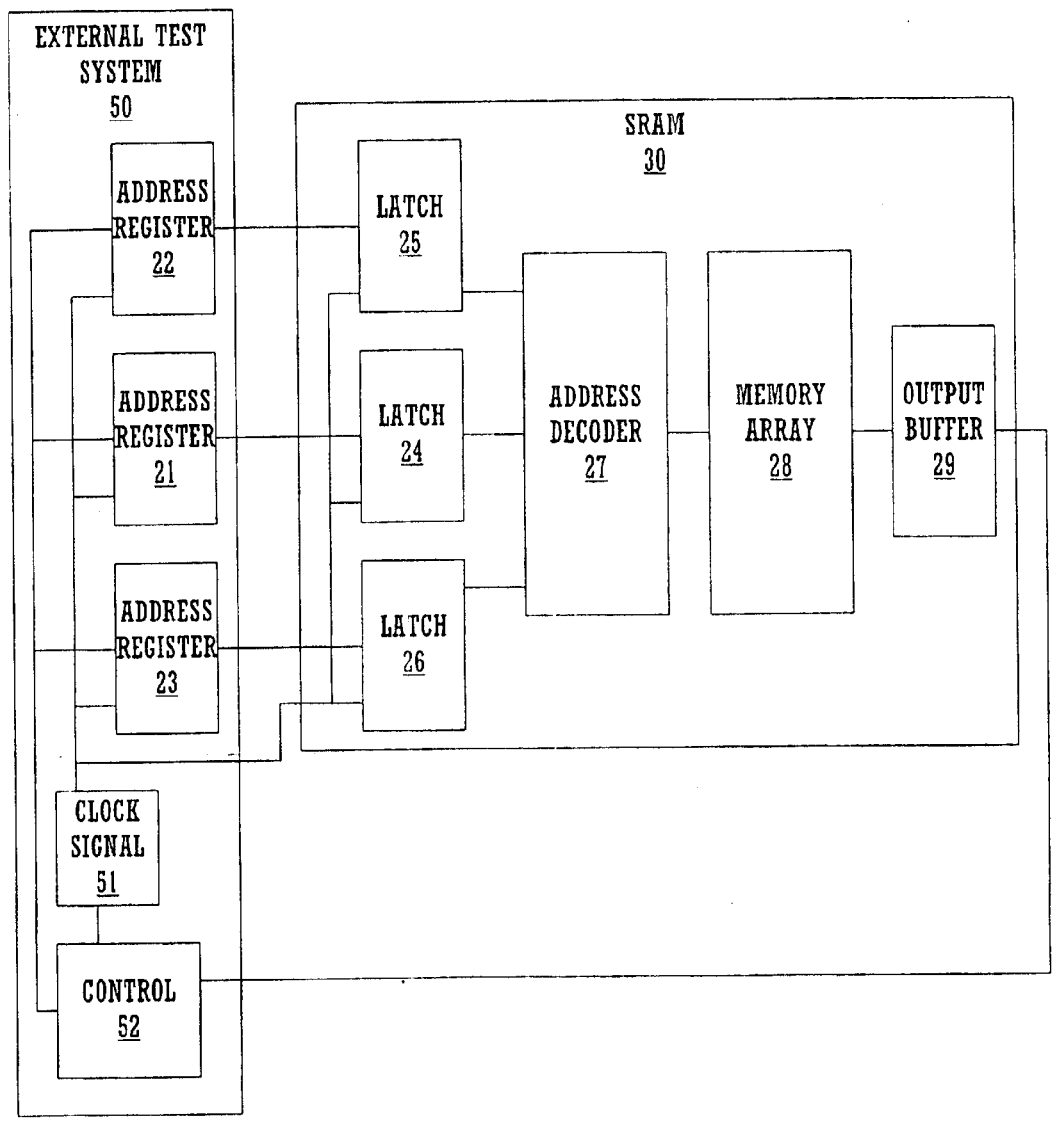
FIG. 1A is a block diagram depicting a typical SRAM, connected to an external test system.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Notation and Nomenclature

Some portions of the detailed descriptions which follow are presented in terms of procedures, logic blocks, processing, and other symbolic representations of operations on data bits within a memory or other electronic device. These descriptions and representations are used by those skilled in the electronic arts to most effectively convey the substance of their work to others skilled in the art. A procedure, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in an electronic system. It has proven convenient at times, principally for reasons of common usage, to refer to these signals as bits, bytes, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "sending," "receiving," "using," "selecting,"

"configuring," "converting," "transferring," "applying," "placing," "sensing," "comparing," "scanning," "inputting," "combining," "holding," "identifying," "accessing," "locating," "updating," "setting," "detecting," or the like, refer to the action and processes (e.g., processes 200, and 700 of FIGS. 2 and 7, respectively) of an integrated circuit such as a synchronous SRAM, ASIC, or similar intelligent electronic and/or microelectronic devices, that manipulate (s) and transform(s) data represented as physical (electronic) quantities within the devices' registers and memories into other data similarly represented as physical quantities within the device memories or registers or other such information storage, transmission or display capabilities.

SRAM Circuit and External Test System

In FIG. 1A, an exemplary SRAM circuit 30 is depicted subjected to setup and hold (SUAH) testing. SRAM 30 is an IC with numerous functional components. Data latched in memory cells 24, 25, and 26, may be written via address decoder 27 to memory array 28. It may be read via output buffer 29. It is appreciated that memory cells 24, 25, and 26 may be registers or latches. In discussing one embodiment of the present invention, memory cells 24, 25, and 26 will be referred to as latches.

Under direction of a control module 52, external test system 50 provides test data inputs via address registers 21, 22, and 23, as well as a clock signal 51 to SRAM 30. The output 31 of SRAM 30 is exported via output buffer 29 to external test system 50, where control module 52 reads this output for test results.

SUAH testing has conventionally required a test pattern which writes data individually to each and every available address. For address registers 21, 22, and 23, each of which having 18 inputs and 18 outputs, the test pattern conventionally must provide $2^{18}$ vectors. For each and every one of the $2^{18}$ addresses, once the test data is inputted, it must be read back out and compared.

SUAH tests are commonly run at various increasing clock frequencies, to determine a point at which the circuit under test fails to operate properly, e.g., at which the data read back from each address is not identical to the data written to that address. Address registers 21, 22, and 23 and latches 24, 25, and 26 are used herein to illustrate by way of example. With clock signal 51 set to an initial test speed, e.g., 1.5 ns, test system 50 which writes data to each and every one of the input lines 0–17 of address registers 21, 22, and 23. The data is sequentially read back from each and every one of the $2^{18}$ addresses. After some passage of time, necessary to write in and read out from each of the address points for the register under test, the data read out is compared to the data as written in to detect identity, indicating a SUAH test pass result, or to identify errors indicating a SUAH test failure result, at the initial frequency. If the SUAH test result is a pass at 1.5 ns, it may be repeated at a higher test frequency, e.g., a clock speed of 1.4 ns.

In this case, with clock signal 51 now set to a speed of 1.4 ns, test system 50 again, conventionally writes data to each and every one of the input lines 0–17 of address register 21. The data is again sequentially read back from each and every one of the $2^{18}$ addresses. After some further passage of time necessary to again write in and read out from each of the address points for the registers under test, the data read out is again compared to the data as written in to detect identity, indicating a SUAH test pass result, or to identify errors indicating a SUAH test failure result, at the second test frequency. If the SUAH test result is a pass at 1.4 ns, it may be repeated at an even higher test frequency, e.g., at a clock speed of 1.3 ns, and then, sequentially, at clock speeds of 1.2 ns, 1.1 ns, etc., seeking the point at which a SUAH test failure is achieved for the particular circuit under test. At each and every test frequency utilized, the same lengthy conventional process of writing into each and every address point, and then reading back out from them to compare the data is repeated.

The time demands for proper SUAH testing by means of the conventional art is substantial, owing to the large number, $2^{18}$, of addresses that must be individually written into, read back from, and compared. It is exacerbated by the necessity of repeating the SUAH tests at increasing frequencies. This situation is illustrated by Table 1, below.

TABLE 1

| TEST SEQUENCE | CLOCK SPEED | NUMBER OF TEST VECTORS |
| --- | --- | --- |
| 1 | 1.5 ns | $2^{18}$ |
| 2 | 1.4 ns | $2^{18}$ |
| 3 | 1.3 ns | $2^{18}$ |
| 4 | 1.2 ns | $2^{18}$ |
| 5 | 1.1 ns | $2^{18}$ |
| 6 | 1.0 ns | $2^{18}$ |

As seen in Table 1, to run the SUAH six (6) times at increasingly faster clock speeds, the total number of addresses requiring test vectors is $6 \times 2^{18}$, e.g., 1,572,864. An embodiment of the present invention reduces the number of test vectors required to test SRAM 30 significantly.

Exemplary Circuits and Processes

Figure 1B:
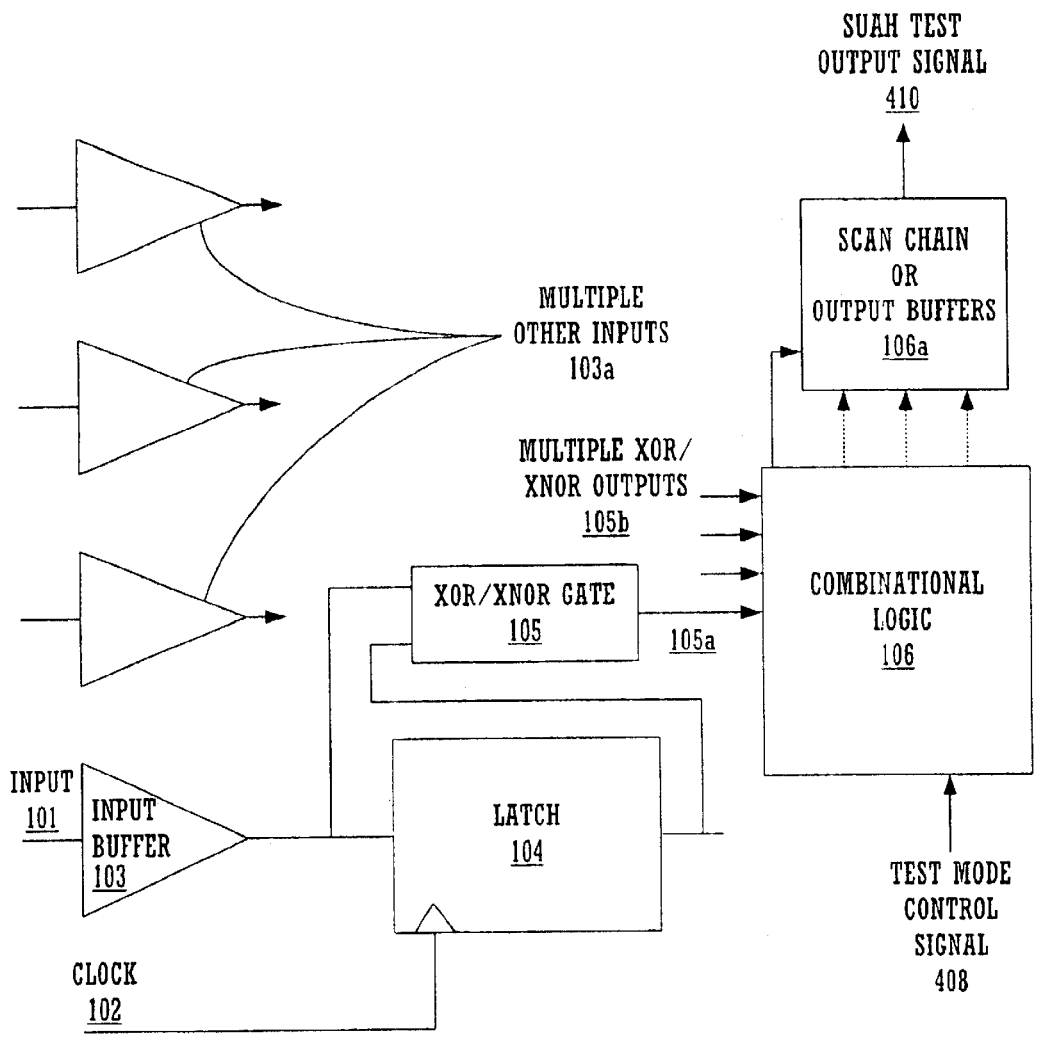
FIG. 1B is a block diagram depicting a circuit for the application of an XOR/XNOR logic gate to detect any difference between the input and output of an individual register or latch, in accordance with one embodiment of the present invention.

With reference to FIG. 1B, an exemplary circuit 100 of one embodiment of the present invention is described. Circuit 100 enables direct setup and hold testing via register/ latch 104. It is appreciated that register/latch 104 may be either type of memory cell. In discussing one embodiment of the present invention, reference will be made to register/ latch 104 as a latch 104.

A data signal input 101 is applied through input buffer 103 to the data input of latch 104. Latch 104 is then clocked high by clock 102. In accordance with one embodiment of the present invention, SUAH testing involves a first data signal input 101 of all zeroes (0), and a second data signal input of all ones (1), a signal inputted to each latch 104.

An exclusive logic gate 105, either an exclusive OR (XOR) gate or an exclusive NOR (XNOR) gate, is connected such that one of its two inputs senses, or receives the same data signal input 101 applied to latch 104. XOR/ XNOR gate 105 is further connected such that the other of its two inputs senses, or receives the data output signal of latch 104 after latch 104 is clocked high. The logic operation of XOR/XNOR gate 105 then compares the two signals at its inputs, one from the input and the other from the output of latch 104. Any difference between each of the inputs at XOR/XNOR gate 105 will be detected by this comparison and treated as a difference, e.g., a detection signal. The output 105a of XOR/XNOR gate 105 reflects the results of this comparison. If a difference is detected, the output 105a is interpreted by the combinational logic block 106 as a pass/fail, depending on the test mode, e.g., setup mode, or hold mode.

In one embodiment of the present invention, circuit 100 can be applied over other inputs 103a with the error signals 105a and 105b of each respective XOR/XNOR circuit test to circuit 106. Circuit 106 output 106a may be exported in one embodiment of the present invention as a single bit or as multiple bits of pass/fail information. In one embodiment, these bits 106a may be scanned out serially. Alternatively, in another embodiment, bits 106*a* may be exported in parallel through output buffers.

The comparison and detection of any difference is performed by inverse techniques depending on whether the exclusive logic of XOR/XNOR gate 105 is characterized as XOR logic or as XNOR logic.

It is appreciated that the setup test may be repeated with a high signal value, e.g., a one (1) transition to a low signal value, e.g., a zero (0). It is further appreciated that the results of setup tests and of hold tests are opposite; e.g., a setup test pass signal is the same signal as a hold test fail signal, performed in that test mode.

Figure 2:
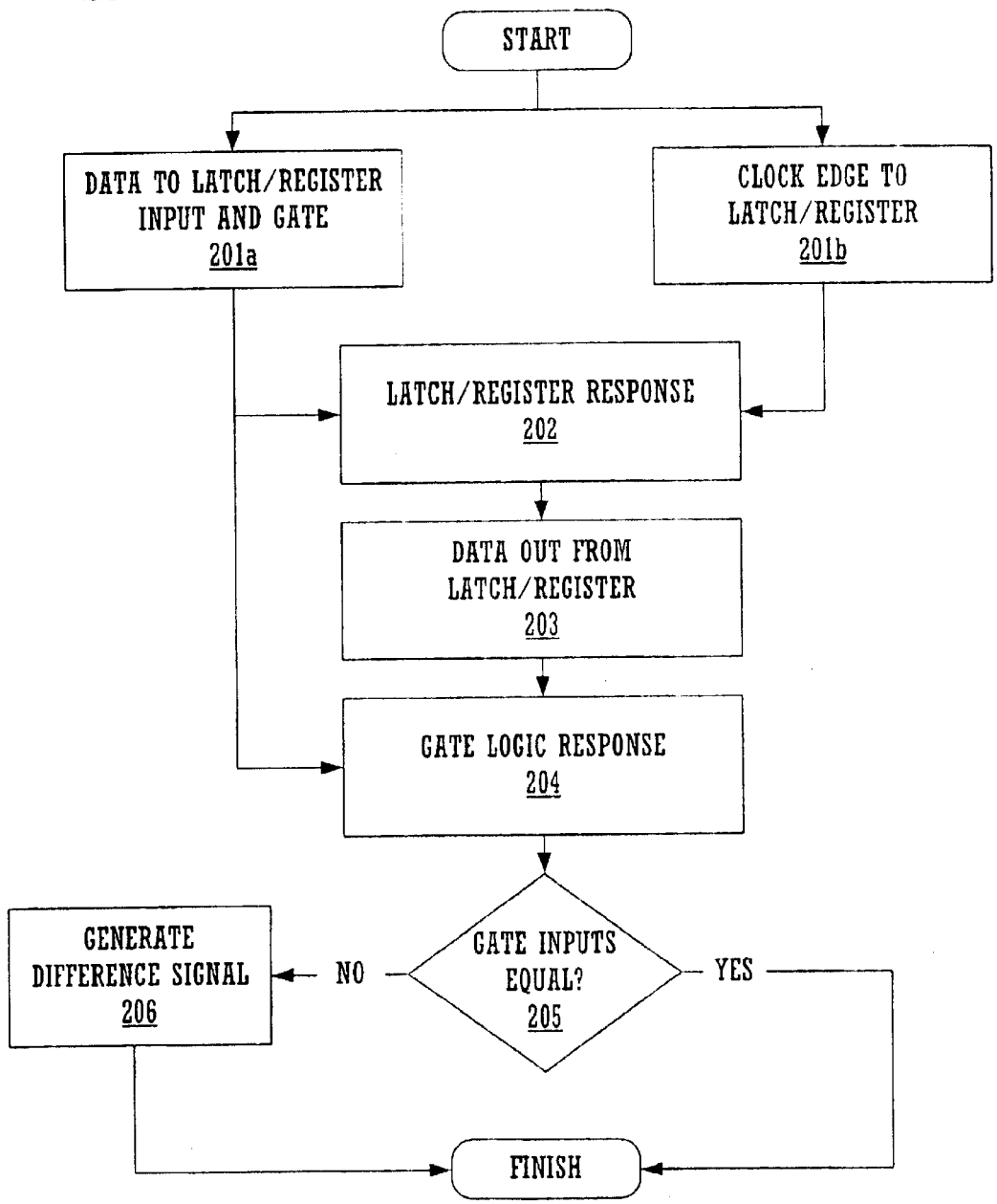
FIG. 2 is a flow chart depicting the steps in a process wherein an XOR logic gate detects any difference between the input and output of an IC input stage latch, in accordance with one embodiment of the present invention.

With reference to FIG. 2, the setup and hold test operation of circuit 100 (e.g., FIG. 1B), in one embodiment of the present invention, is described by a process 200 in which exclusive logic gate (e.g., 105, FIG. 1B) is characterized by exclusive XOR logic. In step 201A, a data signal (e.g., input 101, FIG. 1B), is inputted simultaneously to a memory cell (e.g., latch 104, FIG. 1B) input and one input of an XOR gate (e.g., 105, FIG. 1B). It is appreciated that the memory cell may be either a register or a latch. In the present embodiment, a latch is discussed.

A clock transition (e.g., 102, FIG. 1B) is supplied to the latch (e.g., 104, FIG. 1B), step 201B. The clock transitions from a first state to a second state, e.g., the clock goes high and is held. This occurs for all inputs of the IC under test. In accordance with one embodiment of the present invention, SUAH testing involves a first data signal input 101 of all zeroes (0), and a second data signal input of all ones (1), one of each signal inputted to each latch (e.g., 104, FIG. 1B). Each data signal is held constant following its initial transition. It is appreciated that in another implementation, the memory cell being monitored may be a register. In this implementation, on a first clock transition, new data is read into the register input; previous data is held at the register output. On a second clock transition, the new data is transferred to the register output.

Upon receipt of both the data signal input (e.g., 101, FIG. 1B) and the clock transition (e.g., 102, FIG. 1B), the latch (e.g., 104, FIG. 1B) responds, step 202, such that the data appearing at its output, assumes a binary characteristic, step 203. This characteristic is either identical or opposite to the data signal (e.g., 101, FIG. 1B) at its input. This latch output signal is inputted to the other of the XOR/XNOR gate (e.g., 105, FIG. 1B) inputs. Upon receipt of both inputs, XOR/XNOR gate (e.g., 105, FIG. 1B) compares them and produces a corresponding output, step 204. This XOR/XNOR gate (e.g., 105, FIG. 1B) output in relation to its inputs corresponds to identity or difference between the input and the output of the latch (104, FIG. 1B) it is monitoring step 205. The data input is held constant for the duration of the XOR/XNOR comparison.

In the exemplary case wherein an XOR gate 105 is connected across a latch 104 in accordance with the present embodiment, the output of XOR gate (e.g., 105, FIG. 1B) will be low, e.g., a zero (0), if no difference is detected between each of its inputs, e.g., between data signal input 101 to the latch (e.g., 104, FIG. 1B) and the signal at the output of the latch (e.g., 104, FIG. 1B) after the signal from the clock (e.g., 102, FIG. 1B) goes high. Further, the output of the XOR gate (e.g., 105, FIG. 1B) will be high, e.g., a one (1), if and only if there is a difference detected between each of its inputs. In other words, the output of the XOR gate (e.g., 105, FIG. 1B) will only be high if and only if a difference is detected between data signal input 101 to the latch (e.g., 104, FIG. 1B) and the signal at the output of the latch (e.g., 104, FIG. 1B) after the signal from the clock (e.g., 102, FIG. 1B) goes high. A high output, denoting detection of a difference in the data signals at the latch input and output, from XOR gate 105 constitutes a difference signal, indicating a SUAH test failure at that latch, step 206. A low output from XOR gate 105 constitutes a normal signal, indicating a pass result for the SUAH test at that latch.

It is appreciated that in another implementation, wherein the comparison is made across a memory cell characterized as a register, the test is performed as follows. On a first clock transition, new data is read into the register input; previous data is held at the register output. On a second clock transition, data is transferred to the register output, and the XOR/XNOR comparison is made.

In one embodiment of the present invention, the output of the XOR gate (e.g., 105, FIG. 1B) is transferred into a combinational logic circuit (e.g., 106, FIG. 1B). Simultaneously, the outputs of other XOR gates, each monitoring the other input latches of the IC, are transferred to circuit 106 FIG. 1B) also. Circuit 106 (FIG. 1B) responds to all of these SUAH pass/fail inputs with a test output signal for export to an external testing system.

Alternatively, another embodiment of the present invention incorporates negative logic utilizing exclusive NOR (XNOR) gates. In this embodiment, the output of XNOR gate 105 will be high, e.g., a one (1), if no difference is detected between each of its inputs, e.g., between the data signal input (e.g., 101, FIG. 1B) to the register (e.g., 104, FIG. 1B) and the signal at the output of the latch (104, FIG. 1B) after the signal from clock (e.g., 102. FIG. 1B) goes high. Further, the output of the XNOR gate (e.g., 105, FIG. 1B) will be low, e.g., a zero (0), if and only if there is a difference detected between each of its inputs. In other words, the output of the XNOR gate (e.g., 105, FIG. 1B) will only be low if a difference is detected between the data signal input (e.g., 101, FIG. 1B) to the latch (104, FIG. 1B) and the signal at the output of the latch (e.g., 104, FIG. 1B) after the signal from the clock (e.g., 102, FIG. 1B) goes high. A low output, denoting detection of a difference in the data signals at the latch input and output, from XNOR gate 105 constitutes an error signal, indicating a SUAH test failure at that latch. A high output from XNOR gate 105 constitutes a normal signal, indicating a pass result for the SUAH test at that latch.

In one embodiment of the present invention, the output of the XNOR gate (e.g., 105, FIG. 1B) is transferred into a combinational logic circuit (e.g., 106, FIG. 1B). Simultaneously, the outputs of other XNOR gates, each monitoring the other input latches of the IC, are transferred to circuit 106 (FIG. 1B) also. Circuit 106 (FIG. 1B) responds to all of these SUAH pass/fail inputs with a test output signal for export to an external testing system.

It is appreciated that the setup test may be repeated with a high signal value, e.g., a one (1) transition to a low signal value, e.g., a zero (0). It is further appreciated that the results of setup tests and of hold tests are opposite; e.g., a setup test pass signal is the same signal as a hold test fail signal, performed in that test mode.

Figure 3A:
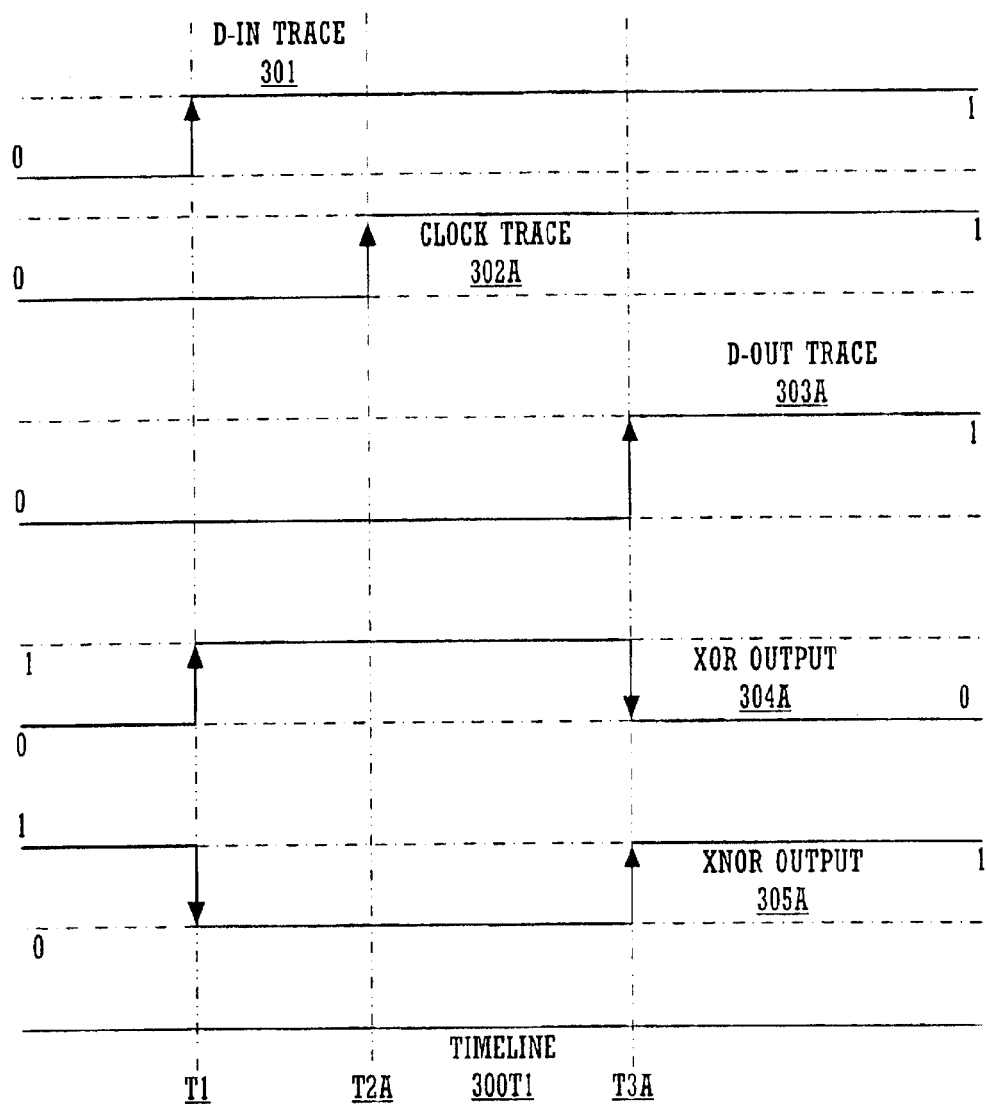
FIG. 3A is a graph of a timeline depicting clock and data signal traces throughout conduct of a SUAH test at an initial test clock speed, with pass results, in accordance with one embodiment of the present invention.

In FIG. 3A, the timing and binary value relationships of the operations of a circuit (e.g., 100, FIG. 1B) in performance of a setup and hold test in accordance with a latch implementation of the present invention may be compared by reference to an exemplary binary signal value trace 300A and timeline 300T1. Along timeline 300T1, time T1 is earliest, preceding time T2A, which precedes the latest time, T3A. Prior to time T1, all circuit values are in an original state. The test results depicted represent a SUAH test pass.

Data-in trace 301 graphically represents the value of an exemplary data input signal (e.g., 101, FIG. 1B) to a latch (e.g., 104, FIG. 1B). The original value of this signal 301 in this embodiment of the present invention is zero (0). At time T1, signal 301 goes high, e.g., to one (1).

Clock trace 302A graphically represents the value of an exemplary clock signal (e.g., 102, FIG. 1B) to the same latch (e.g., 104, FIG. 1B) at an initial SUAH clock frequency. The original value of this clock signal 302 in this embodiment of the present invention is zero (0). At time T2A, subsequent to time T1, signal 302A goes high, e.g., to one (1).

Data-out trace 303A graphically represents the value of an exemplary data output signal from a latch (e.g., 104, FIG. 1B). The original value of this signal 303A in this embodiment of the present invention is zero (0). At time T3A, subsequent to time T2A, signal 303A goes high, e.g., to one (1), corresponding to the data signal 301 at its input.

In one embodiment of the present invention, trace 304A represents the output of an exemplary XOR gate (e.g., 105, FIG. 1B) connected such that one of its two (2) inputs monitors the input to the latch (e.g., 104, FIG. 1B), and the other monitors the output of the latch (e.g., 104, FIG. 1B). Prior to time T1, XOR output 304A is low, e.g., zero (0). At time T1, the value of this XOR gate (105, FIG. 1B) output in this embodiment goes high, e.g., to one (1). At time T3A, upon trace 303A going high to achieve the same value as trace 301, e.g., the latch (e.g., 104, FIG. 1B) output assuming the same value as its input, trace 304A goes low, e.g., to zero (0), reflecting that no difference is detected, upon comparison, between the data signals at the input (e.g., 101, FIG. 1B) and the output of the latch (e.g., 104, FIG. 1B). This indicates a SUAH test pass result at the initial clock frequency.

In one embodiment of the present invention, trace 305A represents the output of an exemplary XNOR gate (e.g., 105, FIG. 1B) connected such that one of its two (2) inputs monitors the input to the latch (e.g., 104, FIG. 1B), and the other monitors the output of the latch (e.g., 104, FIG. 1B). Prior to time T1, XNOR output 305A is high, e.g., one (1). At time T1, the value of this XNOR gate (e.g., 105, FIG. 1B) output in this embodiment goes high, e.g., to one (1). At time T3A, upon trace 303A going high to achieve the same value as trace 301, e.g., the latch (e.g., 104, FIG. 1B) output assuming the same value as its input, trace 305A goes high, e.g., to one (1), reflecting that no difference is detected, upon comparison, between the data signals at the input (e.g., 101, FIG. 1B) and the output of the latch (e.g., 104, FIG. 1B). This indicates a SUAH test pass result at the initial clock frequency.

Figure 3B:
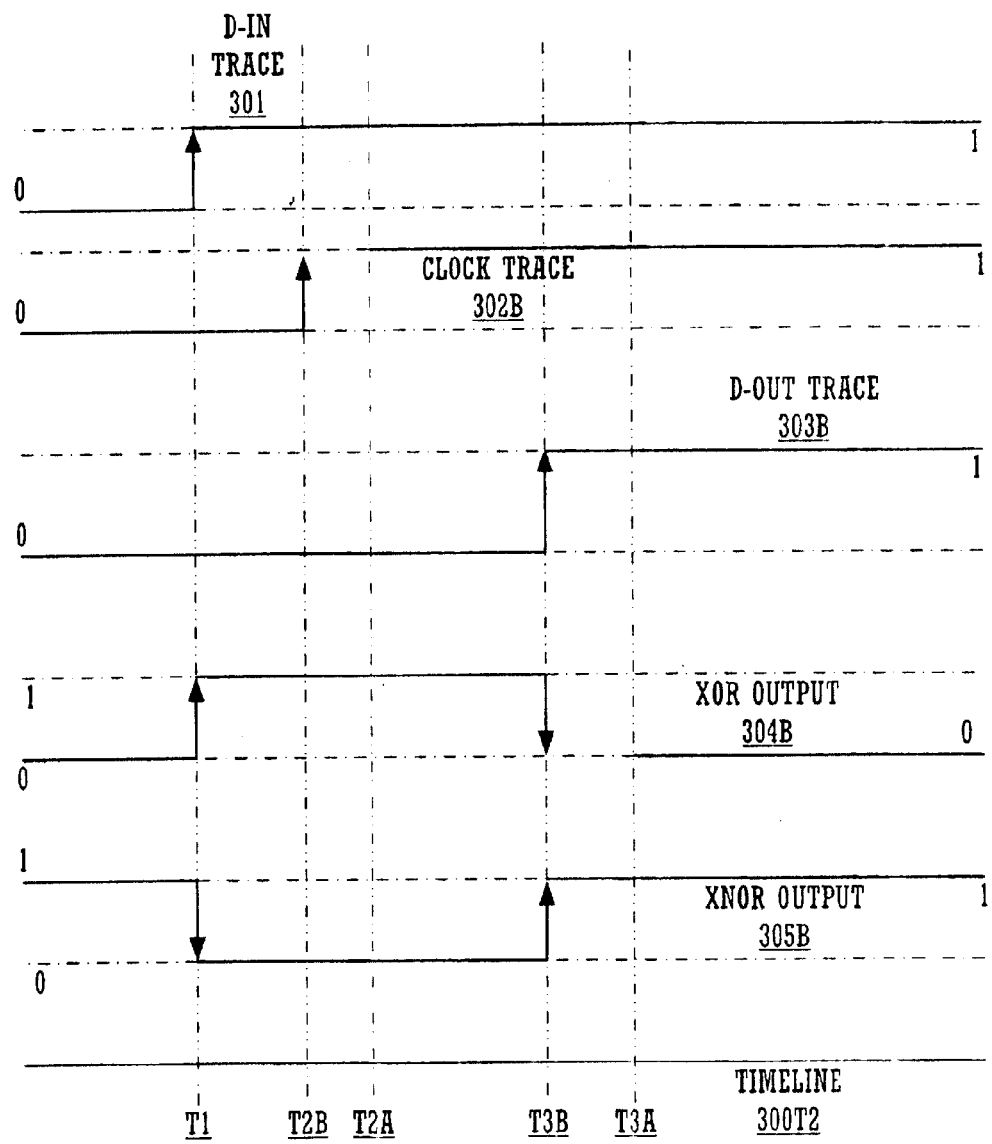
FIG. 3B is a graph of a timeline depicting clock and data signal traces throughout conduct of a SUAH test at a subsequent, higher test clock speed, with pass results, in accordance with one embodiment of the present invention.

In FIG. 3B, the timing and binary value relationships of the operations of a circuit (e.g., 100, FIG. 1B) in performance of a setup and hold test in accordance with a latch implementation of the present invention may be compared by reference to an exemplary binary signal value trace 300B and timeline 300T2. This SUAH test is performed at a clock frequency higher than that at which the SUAH test depicted in FIG. 3A was conducted; accordingly, T3B is earlier than T3A (e.g., from FIG. 3A). Along timeline 300T2, time T1 is earliest, preceding time T2B, which precedes time T2A (e.g., from FIG. 3A), which precedes time T3B. Prior to time T1, all circuit values are in an original state. The test results depicted represent a SUAH test pass at the higher clock frequency.

Data-in trace 301 graphically represents the value of an exemplary data input signal (e.g., 101, FIG. 1B) to a latch (e.g., 104, FIG. 1B). The original value of this signal 301 in this embodiment of the present invention is zero (0). At time T1, signal 301 goes high, e.g., to one (1).

Clock trace 302B graphically represents the value of an exemplary clock signal (e.g., 102, FIG. 1B) to the same latch (e.g., 104, FIG. 1B) at a second, higher SUAH clock frequency. The original value of this clock signal 302 in this embodiment of the present invention is zero (0). At time T2B, subsequent to time T1, but earlier than time T2A, signal 302B goes high, e.g., to 1.

Data-out trace 303B graphically represents the value of an exemplary data output signal from a latch (e.g., 104, FIG. 1B). At time T1, the value of this signal 303B in this embodiment of the present invention is zero (0). At time T3, subsequent to time T2B, signal 303B goes high, e.g., to one (1), corresponding to the data signal 301 at its input.

In one embodiment of the present invention, trace 304B represents the output of an exemplary XOR gate (e.g., 105, FIG. 1B) connected such that one of its two (2) inputs monitors the input to the latch (e.g., 104, FIG. 1B), and the other monitors the output of the latch (e.g., 104, FIG. 1B). Prior to time T1, XOR output 304B is low, e.g., zero (0). At time T1, the value of this XOR gate (e.g., 105, FIG. 1B) output in this embodiment goes high, e.g., to one (1). At time T3, upon trace 303B going high to achieve the same value as trace 301, e.g., the latch (e.g., 104, FIG. 1B) output assuming the same value as its input, trace 304B goes low, e.g., to zero (0), reflecting that no difference is detected, upon comparison, between the data signals at the input (e.g., 101, FIG. 1B) and the output of the latch (104, FIG. 1B). This indicates a SUAH test pass result at the higher clock frequency.

In one embodiment of the present invention, trace 305B represents the output of an exemplary XNOR gate (e.g., 105, FIG. 1B) connected such that one of its two (2) inputs monitors the input to the latch (e.g., 104, FIG. 1B), and the other monitors the output of the latch (e.g., 104, FIG. 1B). Prior to time T1, the value of XNOR output 305B is high, e.g., one (1). At time T1, the value of this XNOR gate (e.g., 105, FIG. 1B) output in this embodiment goes low, e.g., to zero (0). At time T3B, upon trace 303B going high to achieve the same value as trace 301, e.g., the latch (e.g., 104, FIG. 1B) output assuming the same value as its input, trace 305B goes high, e.g., to one (1), reflecting that no difference is detected, upon comparison, between the data signals at the input (e.g., 101, FIG. 1B) and the output of the latch (e.g., 104, FIG. 1B). This indicates a SUAH test pass result at the higher clock frequency.

Figure 3C:
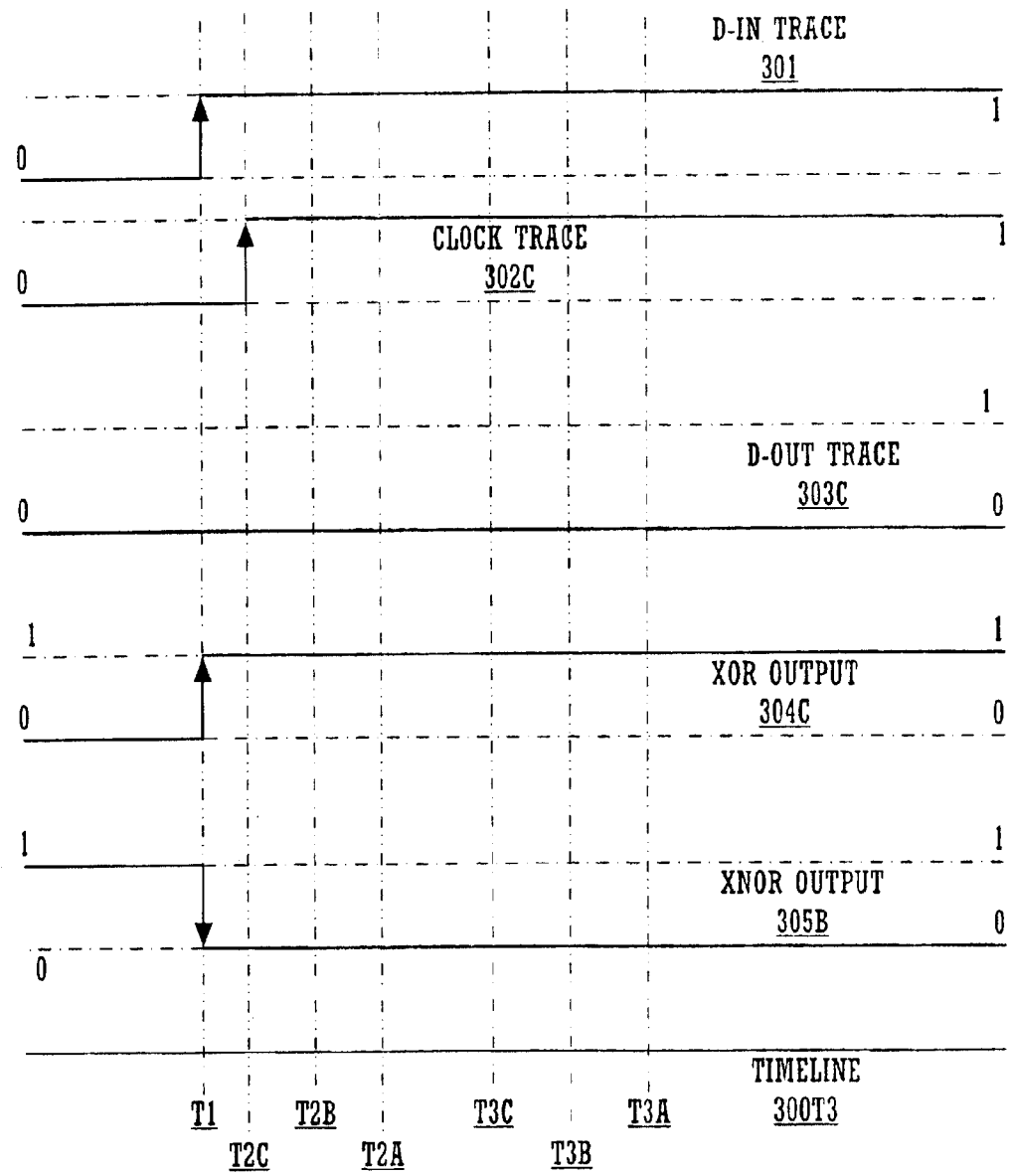
FIG. 3C is a graph of a timeline depicting clock and data signal traces throughout conduct of a SUAH test at a further subsequent higher test clock speed, with fail results, in accordance with one embodiment of the present invention.

In FIG. 3C, the timing and binary value relationships of the operations of a circuit (e.g., 100, FIG. 1B) in performance of a setup and hold test in accordance with a latch implementation of the present invention may be compared by reference to an exemplary binary signal value trace 300C and timeline 300T3. This SUAH test is performed at a clock frequency higher than those at which the SUAH test depicted in FIGS. 3A and 3B were conducted. Accordingly, time T3C is earlier than either T3A (FIG. 3A) or T3B (FIG. 3B). Along timeline 300T3, time T1 is earliest, preceding time T2C, which precedes times T2B (from FIG. 3B) and T2A (from FIGS. 3B and 3A), which precedes the latest time, T3C. Prior to time T1, all circuit values are in an original state. The test results depicted represent a SUAH test failure at this highest clock frequency of the SUAH test series depicted by this and the foregoing FIGS. 3B and 3A.

Data-in trace 301 graphically represents the value of an exemplary data input signal (e.g., 101, FIG. 1B) to a latch (e.g., 104, FIG. 1B). The original value of this signal 301 in this embodiment of the present invention is zero (0). At time T1, signal 301 goes high, e.g., to one (1).

Clock trace 302C graphically represents the value of an exemplary clock signal (e.g., 102, FIG. 1B) to the same latch (e.g., 104, FIG. 1B) at a high SUAH clock frequency. The original value of this clock signal 302 in this embodiment of the present invention is zero (0). At time T2C, subsequent to time T1, signal 302 goes high, e.g., to one (1).

Data-out trace 303C graphically represents the value of an exemplary data output signal from a latch (e.g., 104, FIG. 1B). At time T1, the value of this signal 301 in this embodiment of the present invention is zero (0). At time T3, subsequent to time T2C, there has been no change in the of signal 303A to correspond to the now high data signal 301 at its input, e.g., the value of signal 303A remains at its original value of zero.

In one embodiment of the present invention, trace 304C represents the output of an exemplary XOR gate (e.g., 105, FIG. 1B) connected such that one of its two (2) inputs monitors the input to the latch (e.g., 104, FIG. 1B), and the other monitors the output of the latch (e.g., 104, FIG. 1B). Prior to time T1, the XOR output 304C is low, e.g., zero (0). At time T1, the value of this XOR gate (e.g., 105, FIG. 1B) output in this embodiment goes high, e.g., one (1). At time T3, with trace 303C remaining low in contrast to the now high value of trace 301, e.g., the latch (e.g., 104, FIG. 1B) output assuming an opposite value from its input, trace 304C remains high, e.g., at one (1), reflecting that a difference is detected, upon comparison, between the data signals at the input (e.g., 101, FIG. 1B) and the output of the latch (e.g., 104, FIG. 1B). This indicates a SUAH test failure result.

In one embodiment of the present invention, trace 305C represents the output of an exemplary XNOR gate (e.g., 105, FIG. 1B) connected such that one of its two (2) inputs monitors the input to the latch (e.g., 104, FIG. 1B), and the other monitors the output of the latch (e.g., 104, FIG. 1B). Prior to time T1, the value of XNOR output 305C is high, e.g., one (1). At time T1, the value of this XOR gate (e.g., 105, FIG. 1B) output in this embodiment goes low, e.g., zero (0). At time T3, with trace 303C remaining low in contrast to the now high value of trace 301, e.g., the latch (e.g., 104, FIG. 1B) output assuming an opposite value from its input, trace 305C remains low, e.g., at zero (0), reflecting that a difference is detected, upon comparison, between the data signals at the input (e.g., 101, FIG. 1B) and the output of the latch (e.g., 104, FIG. 1B). This indicates a SUAH test failure result.

Figure 4:
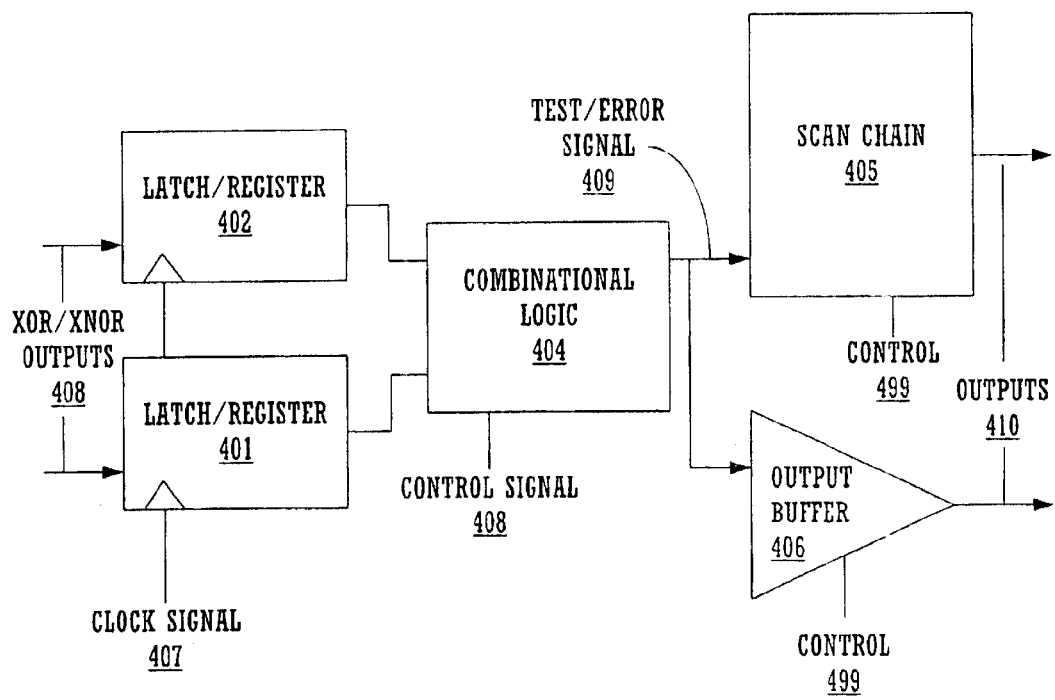
FIG. 4 is a block diagram depicting a circuit for combining XOR/XNOR output signals into a test output signal, in accordance with one embodiment of the present invention.

With reference to FIG. 4, one exemplary combinational logic and output scheme 106 is considered in accordance with one embodiment of the present invention. In scheme 106, output signals 408 from various multiple XOR or XNOR gates (such as XOR/XNOR gate 105, FIG. 1B and XOR/XNOR gates 605A and 605B, FIG. 6), also integrated into the IC (such as IC 600, FIG. 6) are inputted into respective latch/registers 401 and 402.

Upon receiving clock signal 407, latch/registers 401 and 402 provide data accumulated from XOR/XNOR outputs 408 to a combinational logic circuit 404, which combines the data. It is appreciated that a setup test pass has a signature identical to a hold test failure, and vice versa. A control signal 408 shifts circuit 404 from one test mode to the other, e.g., from setup test mode to hold test mode, and vice versa. In one embodiment, this test mode shifting may be accomplished by selective inversion of the comparison signal 408.

Combinational logic 404 provides an output 409 corresponding to the data from registers 401 and 402. If any of XOR/XNOR outputs 408 are characterized as difference signals, combinational logic 404 output 409 is correspondingly an error signal, denoting a test failure in either the setup or the hold mode.

The output of combinational logic 404 may be scanned out serially with the outputs of other IC integral combinational logics by scan register 405. Alternatively, in another embodiment of the present invention, the output of combinational logic 404 may be scanned out more rapidly, in parallel with those of other embedded combinational logics responding to similar SUAH test circuits. In this embodiment, the data from combinational logic 404 provides output 410 directly, via an output buffer 406.

Figure 5:
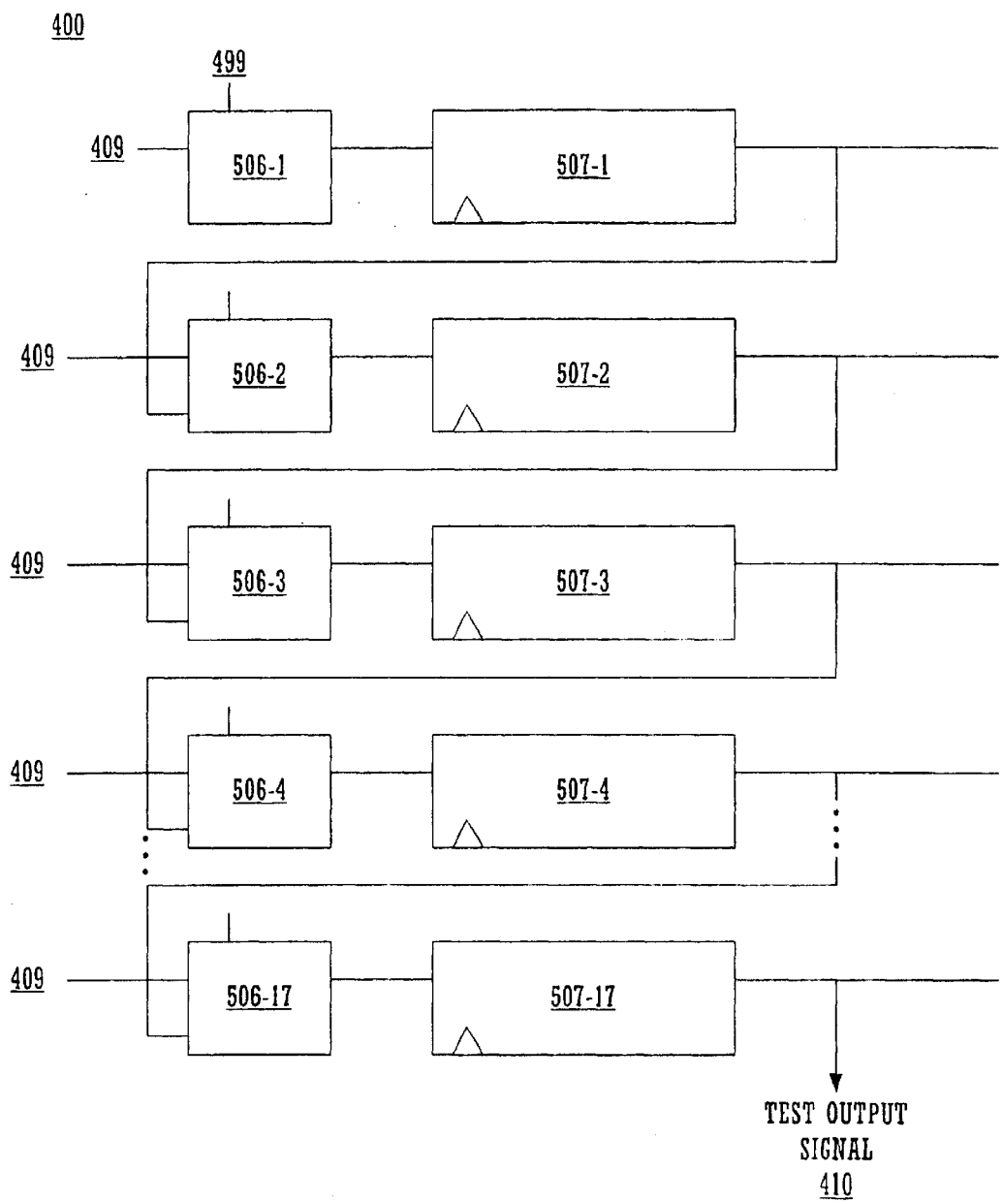
FIG. 5 is a block diagram depicting a scan chain circuit for serially scanning out and transferring test output signals, in accordance with one embodiment of the present invention.

With reference to FIG. 5, a scan chain 405 is described for scanning out SUAH test results, in accordance with one embodiment of the present invention.

Receiving test signals 409 in parallel from combinational logics (e.g., 404, FIG. 4), or directly from registers (e.g., 401 and 402, FIG. 4) the multiplexer (MUX) stage 506-1 through 506-17 relays the data conveyed by test signal to scan registers (SR) 507-1 through 507-17, which store the data. Upon receipt of sequential control signals 499, SRs 507-1 through 507-17 sequentially shift the data to the next respective MUX. Each MUX then combines the data from the respective previous stage, and stores the resulting data in the SR of its own stage.

The resulting accumulated data is thus scanned out serially from the output of SR 507-17, upon receipt of a control signal 408, generating a test output signal 410. If test output signal 410 represents any error signal from any test stage accumulated throughout the testing process from any stage, it constitutes a test error signal, which reflects a SUAH test failure result.

Test output signal 410 may be exported to an external test system (e.g., test system 50, as in FIG. 1A). Alternatively, in another embodiment of the present invention, test signal 409 may be outputted in parallel with the test signals directly from every stage via output buffers (e.g., 406, FIG. 4).

Figure 6:
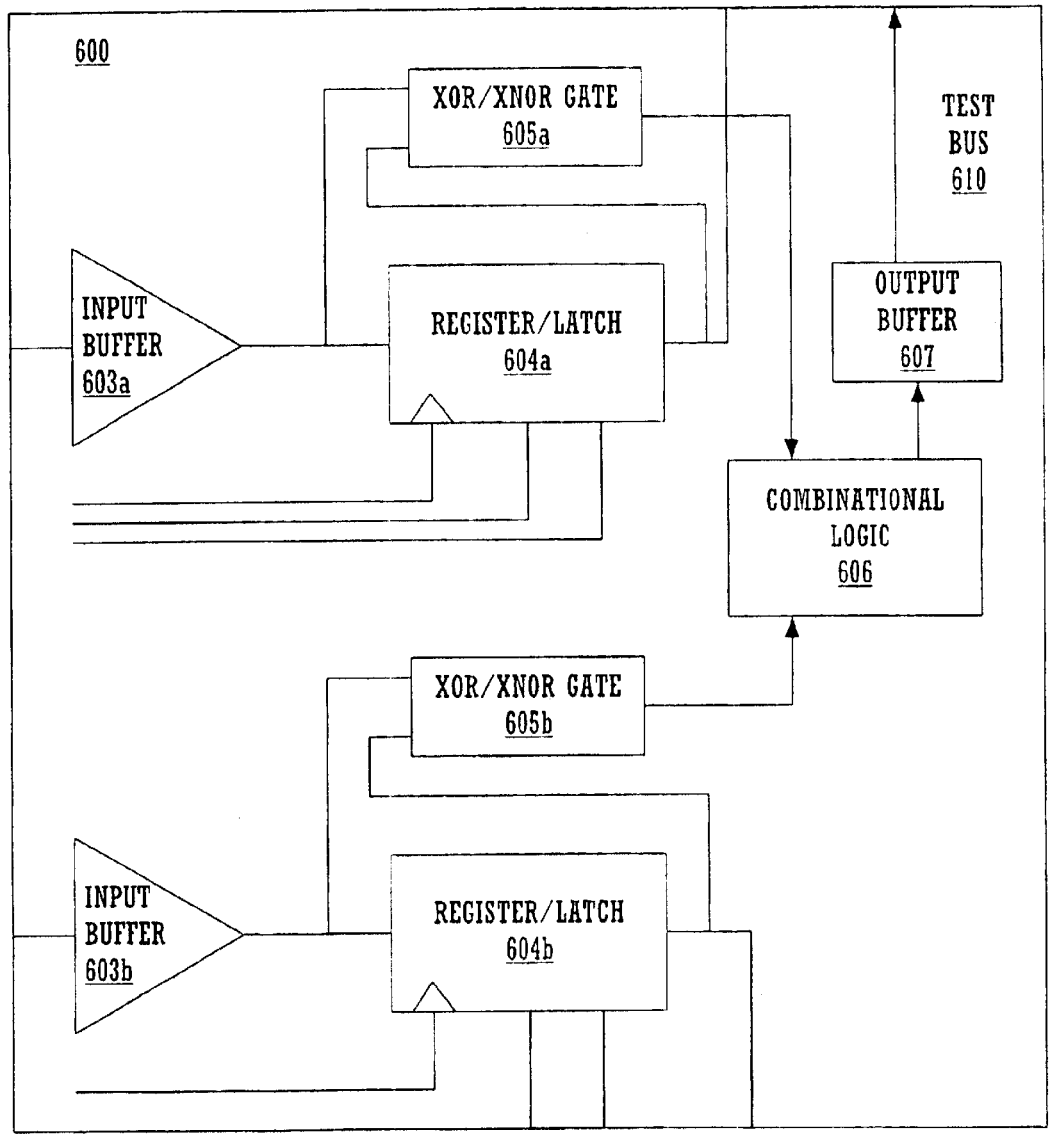
FIG. 6 is a block diagram depicting the relationship of various subcomponents and addresses applied in an embodiment of the present invention as integral to a single integrated circuit.

With reference to FIG. 6, an embodiment of the present invention is depicted as two (2) SUAH test circuits (such as circuit 100, FIG. 1B), embedded in and integral to an integrated circuit (IC) 600. It should be appreciated that as many such circuits may be embedded integral to an IC such as IC 600 as desired or required by the application, limited only by the application and by constraints of large scale integration (LSI), very large scale integration (VLSI) technologies.

For example, a large scale synchronous static random access memory IC (synchronous SRAM), may contain embedded hundreds of integral registers and/or latches such as register/latches 604A and 604B. In some embodiments of the present invention, a SUAH test circuit (such as circuit 100, FIG. 1B) may be present for each and every register/latch.

Again with reference to FIG. 6, register/latches 604A and 604B receive data input signals (such as input 101, FIG. 1B) through input buffers 603A and 603B, respectively. For SUAH test purposes, register/latches 604A and 604B are monitored by XOR/XNOR gates 605A and 605B, respectively. XOR/XNOR gates 605A and 605B compare the input data of register/latches 604A and 604B respectively to their corresponding output data, which input and output data provide the two (2) inputs each to XOR/XNOR gates 605A and 605B.

XOR/XNOR gates 605A and 605B logically compare the data inputs to the data outputs for register/latches 604A and 604B respectively to detect any differences between these data and formulate a corresponding output. XOR/XNOR gates 605A and 605B perform this comparison and formulate their outputs by a logical process such as process 200 (FIG. 2).

The corresponding outputs of XOR/XNOR gates 604A and 604B is accumulated by and combined in combinational logic 606 in this embodiment of the present invention. The corresponding combination signal from combinational logic 606 is outputted from IC 600 on test bus 610 via output buffer 607.

Figure 7:
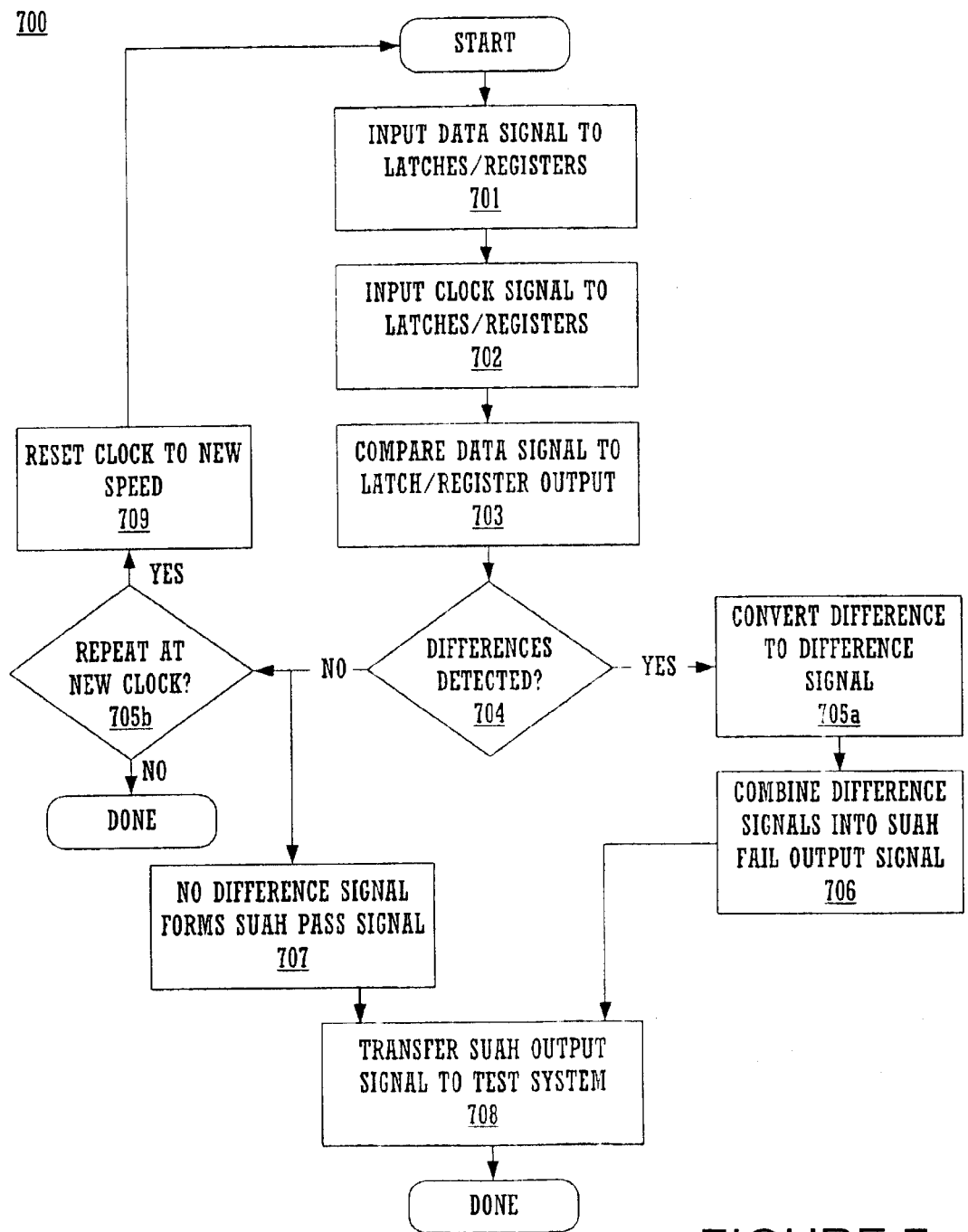
FIG. 7 is a flow chart depicting the steps in a process for conducting setup and hold testing on a microelectronic device, in accordance with one aspect of the present invention.

Referring to FIG. 7, an exemplary overall SUAH test process 700 is shown in accordance with one embodiment of the present invention. To begin, in step 701, a data signal (such as signal 101, FIG. 1B) is inputted to memory cells (e.g., latches or registers, such as 104, FIGS. 1B and 604A and 604B, FIG. 6; reference will be made in the present embodiment to latches). In accordance with one embodiment of the present invention, SUAH testing involves a first data signal input (101, FIG. 1B) of all zeroes (0), and a second data signal input of all ones (1), one of each signal inputted to each latch (e.g., 104, FIG. 1). Then, in step 702, a clock signal (such as from 102, FIG. 1B) is inputted to latches (such as 104, FIGS. 1B and 604A and 604B, FIG. 6).

In step 703, a post-clock transition comparison is made of this data at each input to the data at each latch (e.g., 104, FIGS. 1B and 604A and 604B, FIG. 6) output and any differences detected, step 704. This comparison may be made and differences detected by steps in a logical process (such as 200A and 200B, for XOR and XNOR logic, respectively) by XOR/XNOR logic gates (such as 105, FIG. 1B and 605A and 605B, FIG. 6).

If no differences are detected, a decision is made in step 705B whether to repeat the SUAH test for all registers at a new, higher clock frequency, with a correspondingly shorter test time interval. If the decision is made not to repeat the test at a new clock setting, SUAH testing per process 700 is complete, and a corresponding pass output signal (such as output signals 410, FIG. 4, and 540, FIG. 5) transferred to an external test system, step 707, in accordance with one embodiment of the present invention. If a decision is made to repeat the SUAH test at a higher clock frequency, that frequency is reset in step 709, and the process 700 is repeated at that setting.

If a post clock transition difference between the data at the latch/register (such as 104, FIGS. 1B and 604A and 604B, FIG. 6) is detected, the difference is converted into a difference signal in step 705A. This conversion may be made and differences detected by a steps in a logical process (e.g., 200 FIG. 2) by XOR/XNOR logic gates (such as 105, FIGS. 1B and 605A and 605B, FIG. 6).

Any such difference signals may be combined in step 706, for example by combinational logic (such as combinational logic 404, FIG. 4; 510, FIG. 5; and 606, FIG. 6) into a SUAH Fail output signal (such as output signals 410, FIG. 4, and 540, FIG. 5). This output signal may be transferred to an external test system in one embodiment of the present invention, step 708.

By performing SUAH testing in accordance with this method, significant savings in terms of testing time and resources are appreciated over the conventional art. This savings is multiplied by the repetitive nature of SUAH testing at increasing clock speeds. This may be illustrated by reference to Table 2, below, for an exemplary SRAM (e.g., circuit 30, FIG. 1A) with address registers (e.g., register 21, FIG. 1A), each with 18 inputs. An external test system (50, FIG. 1A) provides test data inputs via address input lines 0–17 of address register 21.

TABLE 2

| TEST SEQUENCE | CLOCK SPEED | TEST VECTORS REQUIRED BY CONVENTIONAL ART | TEST VECTORS REQUIRED BY PRESENT INVENTION |
| --- | --- | --- | --- |
| 1 | 1.5 ns | $2^{18}$ | 2 × 18 = 36 |
| 2 | 1.4 ns | $2^{18}$ | 2 × 18 = 36 |
| 3 | 1.3 ns | $2^{18}$ | 2 × 18 = 36 |
| 4 | 1.2 ns | $2^{18}$ | 2 × 18 = 36 |
| 5 | 1.1 ns | $2^{18}$ | 2 × 18 = 36 |
| 6 | 1.0 ns | $2^{18}$ | 2 × 18 = 36 |

In the conventional art, $2^{18}$ test vectors are required for each and every test sequence; two for each and every memory address. By performing SUAH testing in accordance with an embodiment of the present invention, 216 test vectors are required. A single zero (0) and a single, subsequent one (1) for each of the 18 inputs, with a single output. Further, to run the six tests summarized in Table 2, above, the conventional art requires a total of 1,572,864 test vectors. Thus, the savings in terms of test time are significant over the conventional art.

In summary, the present invention provides a method and circuit thereof for efficiently performing SUAH testing with a greatly reduced number of requisite test vectors. The present invention also provides a method and circuit for performing SUAH testing on memory systems without having to write back into the memory. The present invention further provides a method and system for performing SUAH testing on a single register, which does not require gross involvement of other IC subcomponents. Further still, the present invention provides a method and system for SUAH testing with a relatively small overhead burden on testing resources and low time, resource, and monetary cost.

A method and circuit thereof for performing setup and hold (SUAH) testing on integrated circuits including SRAM utilizing a relatively low number of test vectors, obviating the conventional requirement of writing to and reading back from each and every memory address. In one embodiment, XOR/XNOR gates detect differences in data signals between the inputs and outputs of input stage latches after clocking. In one embodiment, detected differences are combined into an error signal in combinational logic. In one embodiment, error signals are exported serially to a test system by a scan chain. Alternatively, in another embodiment, error signals are exported in parallel by output drivers.

An embodiment of the present invention, a method and circuit thereof for setup and hold detect testing, is thus described. While the present invention has been described in particular embodiments, it should be appreciated that the present invention should not be construed as limited by such embodiments, but rather construed according to the following claims.

What is claimed is:

1. In a microelectronic device with n memory cells at an input stage, a circuit for testing said microelectronic device, said circuit comprising:

a) n first components for comparing data at an input of each of said memory cells to an output of each of said memory cells respectively wherein a first array of n test vectors comprising said data is applied, one said test vector to each said input, said data generated externally to said microelectronic device, and wherein said circuit performs said testing without writing said data back into said memory cells, for detecting any difference between said data at said input of each of said memory cells to said output of each of said memory cells, and for converting said difference into a difference signal;

b) a second component for combining said difference signals for all of said memory cells into an error signal; and c) a third component for processing said error signal and transferring said error signal to an external test system, wherein a second array of n test vectors comprising said data is then applied, one said test vector to each said input, and wherein said test vectors of said second array have a value different from said test vectors of said fist array, and wherein said first components, said second component and said third component repeat their respective functions thereon.

2. The circuit as recited in claim 1 wherein said first components comprise exclusive logic gates.

3. The circuit as recited in claim 2 wherein said first components comprise exclusive OR (XOR) gates.

4. The circuit as recited in claim 2 wherein said first components comprise exclusive NOR (XNOR) gates.

5. The circuit as recited in claim 1 wherein said second component comprises a combinational logic module.

6. The circuit as recited in claim 1 wherein said third component comprises a scan chain register.

7. The circuit as recited in claim 1 wherein said third component comprises an output driver.

8. In a static random access memory device with an input stage having n memory cells therein, a circuit for performing setup and hold testing on said device comprising:

a) n first components for comparing data at an input of each of said memory cells to an output of each of said memory cells respectively wherein a array of n test vectors comprising said data and having a first value is applied, one said test vector to each said input, wherein said data is generated externally to said microelectronic device and wherein said circuit performs said testing without writing said data back into said memory cells, for detecting any difference between said data at said input of each of said memory cells to said output of each of said memory cells, and for converting said difference into a difference signal;

b) a second component for combining said difference signals for all of said memory cells into an error signal; and c) a third component for processing said error signal and transferring said error signal to an external test system, wherein a second array of n test vectors comprising said data is then applied, one said test vector to each said input, and wherein said test vectors of said second array have a value different from said test vectors of said fist array, and wherein said first components, said second component and said third component repeat their respective functions thereon.

9. The circuit as recited in claim 8 wherein said first components comprise exclusive logic gates.

10. The circuit as recited in claim 9 wherein said first components comprise exclusive OR (XOR) gates.

11. The circuit as recited in claim 9 wherein said first components comprise exclusive NOR (XNOR) gates.

12. The circuit as recited in claim 9 wherein said second component comprises a combinational logic module.

13. The circuit as recited in claim 9 wherein said third component comprises a scan chain register.

14. The circuit as recited in claim 9 wherein said third component comprises an output driver.

15. In a microelectronic device, a method for testing comprising:

a) inputting n data signals having a first value, one to each of n memory cells of an input stage of a memory, said signals generated externally to said microelectronic device and said testing performed without writing said data back into said memory cells;

b) clocking said memory cells;

c) for each of said memory cells, comparing said data signal at inputs of said memory cells to a first output signal at an output of each of said memory cells respectively after said clock;

d) for each of said memory cells, detecting a difference between said data signal at said inputs of said memory cells and said first output signal at said output of said memory cells;

e) converting said difference into a difference signal;

f) combining said difference signals for all said memory cells into a second output signal;

g) transferring said second output signal to an test system;

h) inputting n further data signals having a second value to each of said n memory cells of said input stage, wherein said second value is different from said first value: and i) repeating said a)–g).

16. The method as recited in claim 15 wherein said c) comprises:

c1) inputting said data signal at said input of said memory cells to a comparison component; and c2) inputting said first output signal at said output of said memory cells to said comparison component.

17. The method as recited in claim 15 wherein said c)–e) are performed by, exclusive logic gates which are, selectively, XOR gates and XNOR gates.

18. The method as recited in claim 15 wherein said f) is performed in combinational logic.

19. The method as recited in claim 15 wherein said g) is performed by, selectively, a scan chain register and an output driver.

20. The method as recited in claim 15 wherein said microelectronic device is a memory device.

* * * * *